US009006696B2

(12) United States Patent
Tendulkar et al.

(10) Patent No.: US 9,006,696 B2
(45) Date of Patent: Apr. 14, 2015

(54) METAL ALUMINUM NITRIDE EMBEDDED RESISTORS FOR RESISTIVE RANDOM MEMORY ACCESS CELLS

(71) Applicants: Intermolecular Inc., San Jose, CA (US); Kabushiki Kaisha Toshiba, Tokyo (JP); SanDisk 3D LLC, Milpitas, CA (US)

(72) Inventors: Mihir Tendulkar, Mountain View, CA (US); Randall J. Higuchi, San Jose, CA (US); Chien-Lan Hsueh, Campbell, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/480,025

(22) Filed: Sep. 8, 2014

(65) Prior Publication Data

US 2014/0377931 A1    Dec. 25, 2014

Related U.S. Application Data

(63) Continuation of application No. 13/835,256, filed on Mar. 15, 2013, now Pat. No. 8,853,661.

(51) Int. Cl.
*H01L 45/00* (2006.01)
*H01L 27/24* (2006.01)

(52) U.S. Cl.
CPC .......... *H01L 45/165* (2013.01); *H01L 27/2409* (2013.01); *H01L 45/08* (2013.01); *H01L 45/1266* (2013.01); *H01L 45/146* (2013.01); *H01L 45/1616* (2013.01); *H01L 45/147* (2013.01); *H01L 45/1625* (2013.01)

(58) Field of Classification Search
CPC . H01L 34/165; H01L 45/1625; H01L 45/147; H01L 45/146; H01L 45/1266; H01L 45/1616; H01L 45/08; H01L 27/2409
See application file for complete search history.

(56) References Cited

U.S. PATENT DOCUMENTS

| | | | | |
|---|---|---|---|---|
| 5,585,776 A | * | 12/1996 | Anderson et al. | 338/308 |
| 8,212,232 B2 | * | 7/2012 | Lee | 257/4 |
| 8,391,049 B2 | * | 3/2013 | Jo | 365/148 |
| 8,415,652 B2 | * | 4/2013 | Yang et al. | 257/4 |
| 2008/0115359 A1 | * | 5/2008 | Guan et al. | 29/890.1 |
| 2012/0108020 A1 | * | 5/2012 | Baldwin et al. | 438/210 |
| 2013/0134383 A1 | * | 5/2013 | Hwang et al. | 257/5 |

* cited by examiner

*Primary Examiner* — William Coleman

(57) ABSTRACT

Provided are resistive random access memory (ReRAM) cells and methods of fabricating thereof. A ReRAM cell includes an embedded resistor and resistive switching layer connected in series. The embedded resistor prevents excessive electrical currents through the resistive switching layer, especially when the resistive switching layer is switched into its low resistive state, thereby preventing over-programming. The embedded resistor includes aluminum, nitrogen, and one or more additional metals (other than aluminum). The concentration of each component is controlled to achieve desired resistivity and stability of the embedded resistor. In some embodiments, the resistivity ranges from 0.1 Ohm-centimeter to 40 Ohm-centimeter and remains substantially constant while applying an electrical field of up 8 mega-Volts/centimeter to the embedded resistor. The embedded resistor may be made from an amorphous material, and the material is operable to remain amorphous even when subjected to typical annealing conditions.

20 Claims, 5 Drawing Sheets

Initial Forming ↓

↕ Operational Switching

METAL ALUMINUM NITRIDE EMBEDDED RESISTORS FOR RESISTIVE RANDOM MEMORY ACCESS CELLS

CROSS-REFERENCE TO RELATED APPLICATIONS

This is a Continuation application of U.S. patent application Ser. No. 13/835,256, filed on Mar. 15, 2013, which is herein incorporated by reference for all purposes.

BACKGROUND

Nonvolatile memory is computer memory capable of retaining the stored information even when unpowered. Nonvolatile memory may be used for secondary storage or long-term persistent storage, for example, in addition to volatile memory. Nonvolatile memory can be permanently integrated into computer systems (e.g., solid state hard drives) or it can take the form of removable and easily transportable memory cards (e.g., Universal Serial Bus flash drives). Nonvolatile memory is becoming more popular because of its small size and high density, low power consumption, fast read and write rates, data retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory (ReRAM), are being developed to meet these demands and requirements.

SUMMARY

Provided are resistive random access memory (ReRAM) cells and methods of fabricating thereof. A ReRAM cell includes an embedded resistor and resistive switching layer connected in series within the cells. For example, the embedded resistor and resistive switching layer may be just two layers of a stack that forms a ReRAM cell. The embedded resistor prevents excessive electrical currents through the resistive switching layer, especially when the layer is switched into its low resistive state. The embedded resistor includes components such as aluminum, nitrogen, and one or more additional metals (other than aluminum), which are collectively referred to as metal aluminum nitride. The one or more additional metals that are not aluminum may be also referred to as base metals. The concentration of each component is controlled to achieve a desired resistivity and electronic and thermal stability of the embedded resistor.

In some embodiments, the resistivity ranges from 0.1 Ohm-centimeter to 40 Ohm-centimeter and remains substantially constant while applying an electrical field of up 8 mega-Volts/centimeter to the embedded resistor and/or when subjecting the ReRAM cells to a thermal annealing of up to 750° C. for up to 60 seconds, for example. The embedded resistor may be made from an amorphous material, and the material remains substantially amorphous even when subjected to fabricating and operating conditions. For purposes of this document, the term "substantially amorphous" is defined as the characteristic of the material that has a Full Width Half Maximum (FWHM) of any of the material's X-Ray diffraction (XRD) peaks being greater than 2 degrees.

In some embodiments, a ReRAM cell including a resistive switching layer and an embedded resistor. The resistive switching layer is operable to change a resistance between a low resistive state and a high resistive state. The embedded resistor is connected in series with the resistive switching layer and is operable to limit a current passing through the resistive switching layer. The embedded resistor including a metal aluminum nitride, which includes also a metal other than aluminum. The embedded resistor is operable to maintain a constant resistance while the resistive switching layer changes the resistance between the low resistive state and the high resistive state. The concentration of nitrogen in the embedded resistor is between 20 atomic % and 60 atomic %. The concentration ratio of the one or more metals to aluminum is between 0.1 and 10 or, more specifically, between 0.5 and 2. The material of the embedded resistor is amorphous. Specifically, the material of the embedded resistor is operable to withstand a temperature of up to 750° C. for up to 60 seconds while remaining substantially amorphous.

In some embodiments, the embedded resistor includes two metals in addition to aluminum, i.e., a first metal and a second metal. The concentration ratio of the first metal to the second metal may be between 0.5 and 2 based on atomic concentrations. The first metal may have a higher concentration at one side of the embedded resistor than away from sides of the embedded resistor. The two metals may be hafnium and tantalum. In some embodiments, the one or more metals of the embedded (i.e., other than aluminum) include one or more elements from Groups IIIA-VIIA and Groups IIIB-VIIB of the periodic table, such as zirconium, vanadium, niobium, chromium, hafnium, tantalum, titanium, tungsten, or molybdenum. In some embodiments, the one or more metals include hafnium, tantalum, titanium, tungsten, or molybdenum.

In some embodiments, the embedded resistor has a resistivity between 0.1 Ohm-centimeter to 40 Ohm-centimeter. The resistivity of the embedded resistor may change by less than one order of magnitude while applying an electrical field of up 8 mega-Volts/centimeter to the embedded resistor. The embedded resistor may have a resistance of 90 kilo-Ohm to 210 kilo-Ohm. The embedded resistor has a thickness of between 50 Angstroms to 500 Angstroms.

In some embodiments, the ReRAM cell also includes an electrode disposed between the embedded resistor and the resistive switching layer. The ReRAM cell may also include a diode connected in series with the embedded resistor and the resistive switching layer.

Provided also is a method of fabricating a ReRAM cell. The method may involve forming a resistive switching layer operable to change a resistance between a low resistive state and a high resistive state. The method may also involve forming an embedded resistor connected in series with the resistive switching layer. The embedded resistor may include a metal aluminum nitride, which includes a metal other than aluminum. The material of the embedded resistor may be amorphous. The embedded resistor is operable to maintain a change in a resistance within one order of magnitude while the resistive switching layer changes the resistance between the low resistive state and the high resistive state. The method also involves annealing the ReRAM cell at a temperature of up to 750° C. for up to 60 seconds. The material of the embedded resistor remains amorphous after the annealing.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

Figure 1A:
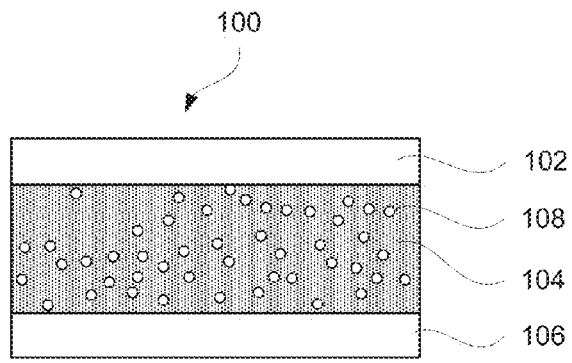
FIG. 1A illustrate schematic representations of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A memory cell exhibiting resistive switching characteristics, which is often referred to as a ReRAM cell, generally includes multiple layers formed into a stack. At least two of these layers forming the ends of the stack are used for electrically coupling the cell to other components, such as other ReRAM cells of the memory array, controller. At least one intermediate layer of the cell is operable to change its resistance between a low resistive state and a high resistive state, which are associated with bits of data, e.g., "0" and "1". The ReRAM cell may also include a current steering element (e.g., a diode) for controlling a direction of the current flow through the cell and/or an embedded resistor that prevents excessive currents from passing through the cells.

The ReRAM cell changes its resistive state by applying one or more voltage pulses to the cell as further explained below. The applied voltage generates a current through the cell or, more specifically, through the resistive switching layer and causes some localized heating within the switching region within the cell. Without being restricted to any particular theory, it is believed that a combination of the electrical field and localized heating (both created by the applied voltage) causes formation and breakage of various conductive paths within the switching region. It is believed that defects change their location forming the conductive paths (when the set voltage is applied) and breaking the conductive paths (when the reset voltage is applied) and causing changes in the resistance.

The change in resistance of the resistive switching layer is a dynamic process that needs to be well controlled to prevent over-programming. For example, when the resistive switching layer is switched from its high resistive state to its low resistive state, the drop in resistance may cause an excessive current through the resistive switching layer and overheating. As such, set and reset voltages are applied in very short pulses, e.g., about 50 nanoseconds, followed by a reading pulse to determine a current resistive state of the resistive switching layer. If the desired resistive state is not reached, another pulse is applied. The process of applying switching and reading pulses may be repeated until the desired resistance is not reached.

Even during a relatively short switching pulse, the change in resistance may be sufficiently large resulting in a current spiking and over-programming. In some embodiments, the difference in resistances of the low resistive state and the high resistive state may be more than an order of magnitude. The embedded resistor is connected in series with the resistive switching layer and is used to prevent this current spiking. The embedded resistor effectively functions as a voltage divider within the ReRAM cell and maintains a contact resistance throughout the entire operation of the cell. In addition to having a constant resistance regardless of the applied field, the embedded resistor has a certain predetermined resistivity, such as between about 0.1-40 Ohm-cm or, more specifically, 1-4 Ohm-cm. As such, the embedded resistor is clearly distinguishable from signal lines and electrodes, which have substantially lower resistivities (e.g., less than 0.001 Ohm-cm), and resistive switching layer, which change their resistance.

Embedded resistors are subjected to a few design and fabrication constraints. First, the thickness of embedded resistors is between about 10 Angstroms to about 500 Angstroms or, more specifically, between 20 Angstroms to about 100 Angstroms. In order to achieve an adequate voltage drop, the resistivity of the material forming the embedded resistor has to be between about 0.1-40 Ohm-cm or, more specifically, 1-4 Ohm-cm. Furthermore, these thickness values place significant constraints on fabrication options and even materials selections. Not that many materials can be formed into such thin layers and achieved the desired resistivity as well thermal and electrical stability characteristics. For example, diode activation subjects the entire ReRAM cell including its embedded resistor to a temperature of up to 750° C. or more for up to about 1 minute or more. The embedded resistor material should not exhibit any significant loss in its resistivity or compromise the remaining materials in the stack by, for example, displacing some of its components into adjacent layers. The change in resistivity after being subject to the diode activation should be less than an order of magnitude. The embedded resistor needs to have constant resistance characteristics and demonstrate only a slight decrease in its resistance when subjecting to strong fields, e.g., up to 8 mega-Volts/centimeter. Furthermore, the material of the embedded resistor should not be oxygen-scavenging, which may interfere with the composition and performance of the resistive switching layer.

Additionally, materials used for embedded resistors should be easily deposited using processes, such as Atomic Layer Deposition (ALD). For example, some materials, such as metal silicon nitrides, may provide suitable characteristics as bulk layer, but difficult to fabricate into thinner layers, e.g., below 200 Angstroms. Substituting silicon with aluminum opens the door to new ALD precursors and new fabrication and integration schemes.

Provided are ReRAM cells having embedded resistors fabricated from metal aluminum nitrides. For purposes of this description, an metal aluminum nitride is defined as a material including aluminum, nitrogen, and one or more additional metals (other than aluminum), which may be referred to as base metals. Some examples of the base metals include elements from Groups IIIA-VIIA and IIIB-VIIB of the periodic table such as zirconium, vanadium, niobium, chromium, aluminum, hafnium, tantalum, titanium, tungsten, and molybdenum. The concentration of each component is controlled to achieve a desired resistivity and electronic and thermal stability of the embedded resistor. For example, a concentration ratio of the one or more base metals to aluminum is between about 0.1 and 10 based on the atomic concentrations or, more specifically, between about 0.5 and 2.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including top electrode 102, bottom electrode 106, and resistance switching layer 104 disposed in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, diffusion barrier layer, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to forming operation and all defects are provided from top electrode 102 during forming. Bottom electrode 106 may or may not have any defects. It should be noted that regardless of presence or absence of defects in bottom electrode 106, substantially no defects are exchanged between bottom electrode 106 and resistive switching layer 104 during forming and/or switching operations.

Figure 1B:
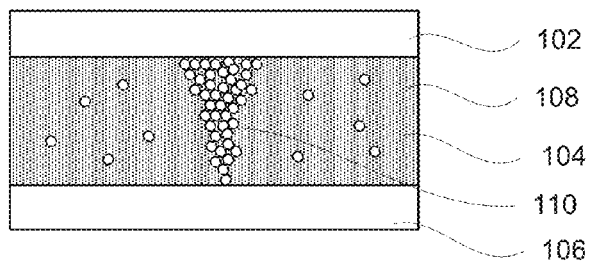
FIGS. 1B and 1C illustrate schematic representations of the ReRAM cell in its high resistive state (HRS) and low resistive state (LRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
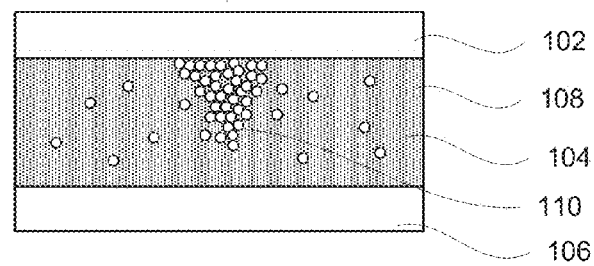

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
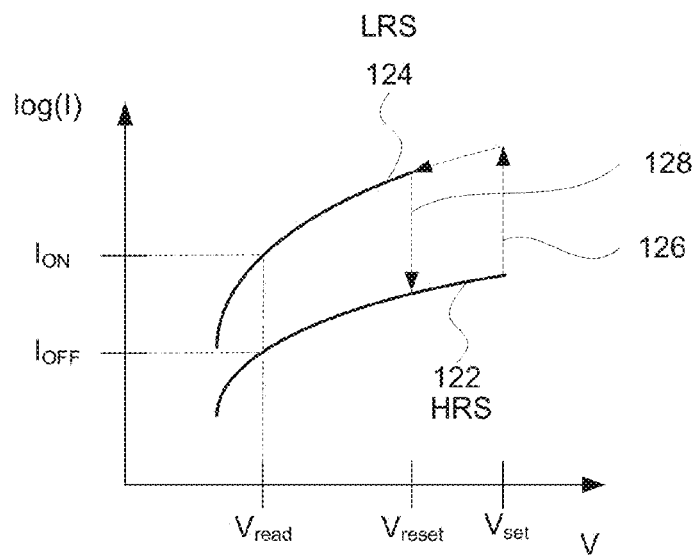
FIG. 2A illustrates a plot of a current passing through a unipolar ReRAM cell as a function of a voltage applied to the ReRAM cell, in accordance with some embodiments.
Figure 2B:
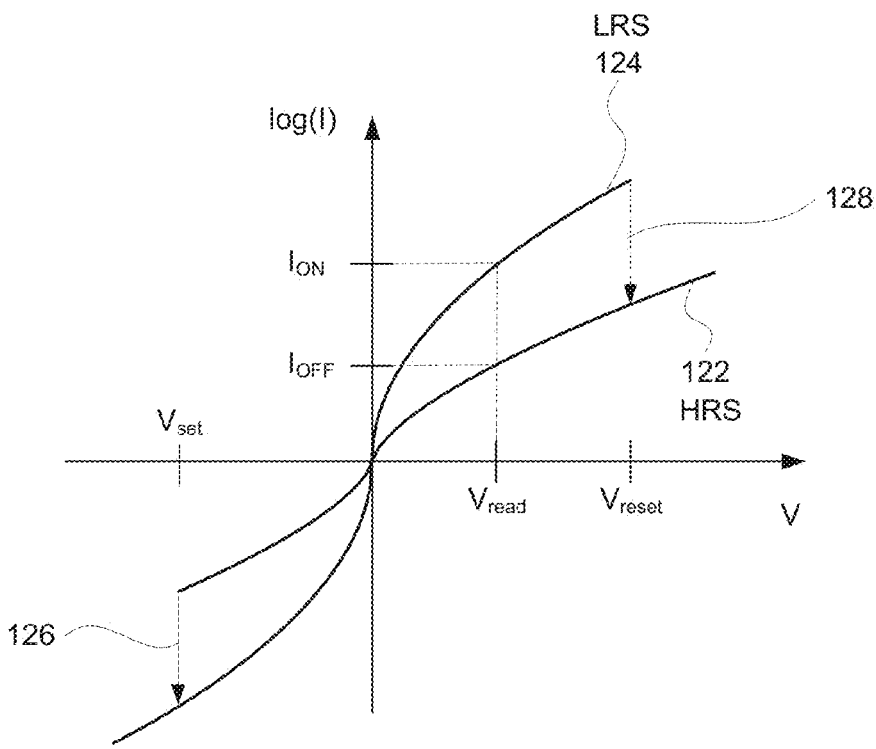
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistance switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistance switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20 Å of oxide thickness in HRS.

Examples of ReRAM Cells

Figure 3:
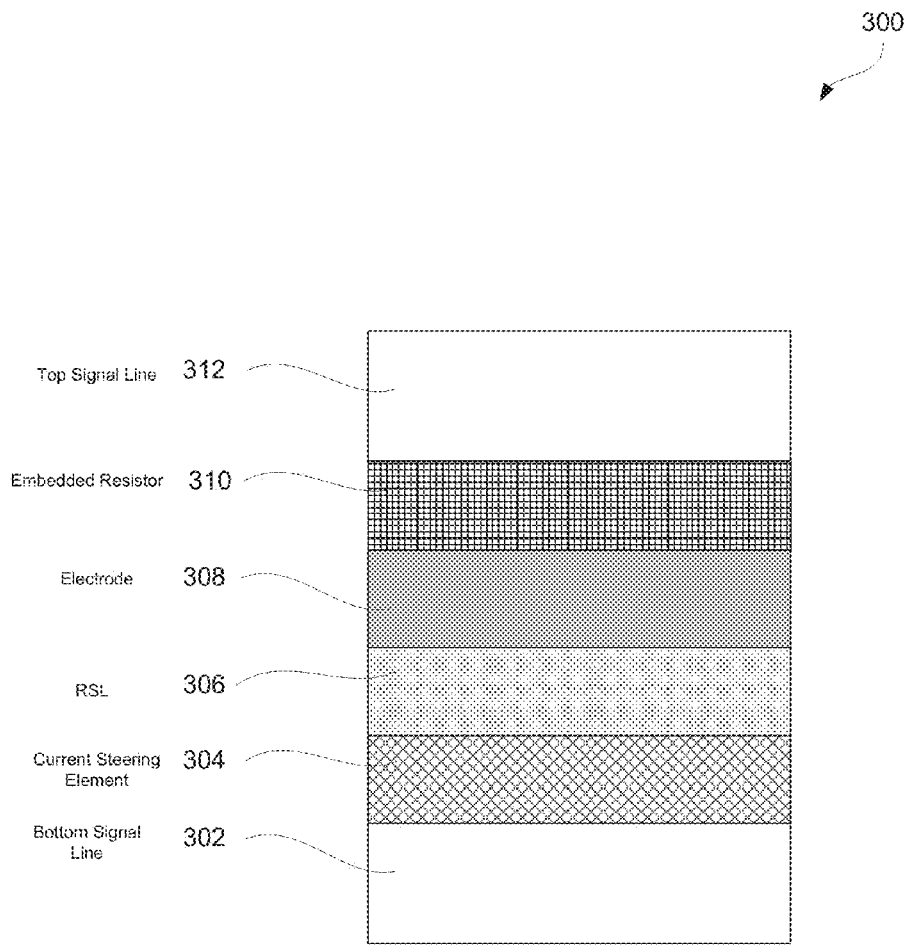
FIG. 3 illustrates a schematic representation of a ReRAM cell including an embedded resistor, resistive switching layer, and other components, in accordance with some embodiments.

FIG. 3 illustrates a schematic representation of a ReRAM cell 300, in accordance with some embodiments. ReRAM cell 300 may include a bottom signal line 302, a current steering element 304, a resistive switching layer 306, an intermediate electrode 308, an embedded resistor 310, and a top signal line 312. The "top" and "bottom" terminology is used herein only for differentiating reasons and does not imply any deposition order or spatial orientation of the layers unless specifically noted. In some embodiments, ReRAM cell 300 has more or fewer layers. For example, an intermediate layer may be disposed between electrode 308 and embedded resistor 310 in order, for example, to improve electrical connection between electrode 308 and embedded resistor 310.

In the example illustrated in FIG. 3, a portion of current steering element 304 is also operable as another electrode. Typically, resistive switching layer 306 directly interfaces two electrodes, e.g., a top electrode and a bottom electrode. One electrode may be an inert electrode and may not exchange defects with resistive switching layer 306, while another electrode may be active and may exchange defects with resistive switching layer 306. For example, a titanium nitride electrode may accept and release oxygen vacancies into resistive switching layer 306, while a doped polysilicon electrode may form a passivation silicon oxide layer that block defects from going in and out of resistive switching layer 306. In the illustrated example, current steering element 304 may include a bottom p-doped polysilicon portion, which interfaces bottom signal line 302, a top n-doped polysilicon portion, which interfaces resistive switching layer 306 and is operable as an electrode, more specifically, an inert electrode. However, in some embodiments, ReRAM cells may include two electrodes that are standalone components. Furthermore, the electrodes may be sufficiently conductive and operable as signal lines. In the illustrated examples, signal lines 302 and 312 are separate components from electrodes.

Bottom signal line 302 and top signal line 312 provide electrical connections to ReRAM cell 300. For example, bottom signal line 302 and/or top signal line 312 extend between multiple ReRAM cells, which may be cells provided in the same row or the same column of a memory array as further described below with reference to FIGS. 5A and 5B. Bottom signal line 302 and top signal line 312 may be made from conductive materials, such as n-doped polysilicon, p-doped polysilicon, titanium nitride, ruthenium, iridium, platinum, and tantalum nitride. The signal lines may have a thickness of less than about 1,000 Angstroms, such as less than about 500 Angstroms and even less than about 100 Angstroms. Thinner electrodes may be formed using ALD techniques.

Current steering element 304 may be an intervening electrical component, such as a p-n junction diode, p-i-n diode, transistor, or other similar device disposed between bottom signal line 302 and top signal line 312. As such, current steering element 304 is connected in series with resistive switching layer 306. In some embodiments, current steering element 304 may include two or more layers of a semiconductor material, such as two or more doped silicon layers, that are operable to direct the flow of current through the device. Current steering element 304 may be a diode that includes a p-doped silicon layer, an un-doped intrinsic layer, and an n-doped silicon layer. These layers are not specifically identified in FIG. 3. The overall resistance of current steering element 304 may be between about 1 kilo-Ohm and about 100 Mega-Ohm. The overall resistance generally depends on the type of current steering element 304 and direction of the current flow through current steering element 304 (e.g., forward or reversed biased).

Resistive switching layer 306 can be fabricated from a dielectric material, such as a metal oxide material or other similar material that can be switched between two or more stable resistive states. In some embodiments, resistive switching layer 306 is fabricated from a high bandgap material, e.g., a material that has a bandgap of at least about electron Volts. Some examples of such materials include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). The high bandgap materials may improve data retention in ReRAM cell 300 and reduce the current leakage since the amount of trapped charge in these materials is less than a lower bandgap material. Furthermore, the high bandgap materials create a large barrier height that the carriers have to cross during the read, set, and reset operations. Other suitable materials for resistive switching layer 306 include titanium oxide ($TiO_x$), nickel oxide ($NiO_x$), and cerium oxide ($CeO_x$). Furthermore, semi-conductive metal oxide (p-type or n-type), such as zinc oxides ($Zn_xO_y$), copper oxides ($Cu_xO_y$), and their nonstoichiometric and doped variants can be used for resistive switching layer 306.

In some embodiments, resistive switching layer 306 includes a dopant that has an affinity for oxygen, such as various transition metals (e.g., aluminum, titanium, and zirconium), to form a metal-rich resistive switching layer, such as a non-stoichiometric oxide (e.g., $HfO_{1.5}$-$HfO_{1.9}$ or, more specifically, $HfO_{1.7}$). The dopant may be the same materials as a metal of the base oxide (e.g., $HfO_2$ doped with hafnium) or different (e.g., $HfO_2$ doped with aluminum, titanium, and zirconium). Oxygen deficiency of the metal-rich resistive switching layer corresponds to a number of oxygen vacancies, which are believed to be defects responsible for resistive switching. The amount of defects is controlled to achieve certain switching and forming voltages, operating currents, improve performance consistency and data retention.

Resistive switching layer 306 may have a thickness of between about 10 Angstroms to about 1000 Angstroms, such as between about 20 Angstroms and 200 Angstroms or, more specifically, between about 50 Angstroms and 100 Angstroms. Thinner resistive switching layers may be deposited using ALD, while thicker resistive switching layers may be deposited using may be deposited using ALD as well as physical vapor deposition (PVD) and, in some embodiments, chemical vapor deposition (CVD).

Electrode 308 may be fabricated from a conductive material that has a desirable conductivity and work function, such as p-type polysilicon, n-type polysilicon, transition metals, transition metal alloys, transition metal nitrides, or transition metal carbides. For example, electrode 308 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 308 may include titanium/aluminum alloy and/or a silicon-doped aluminum. In some embodiments, electrode 308 may be formed from titanium, tantalum, or aluminum. Electrode 308 may be between about 50 Angstroms and about 5000 Angstroms thick or, more specifically, between about 100 Angstroms and about 1000 Angstroms thick.

Embedded resistor 310 is fabricated from a metal aluminum nitride that includes at least three elements: aluminum, nitrogen, and a base metal that is other than aluminum. In some embodiments, embedded resistor 310 may include multiple base metals, such as two, three, or even more base metals. Incorporation of aluminum and nitrogen tends to increase resistivity of the overall embedded resistor material, while the base metal helps to maintain its stable resistivity and high breakdown voltage characteristics. Furthermore, metal aluminum nitrides tend to be stable when subjected to processing temperatures, such as at least about 750° C. for 60 seconds used for diode activation. In some embodiments, embedded resistor 310 retains its characteristics when subjected to a temperature of between about 500° C. to 1000° C. for about 10 seconds to 10 minutes.

Many conventional materials used for resistors, such as tantalum nitride, tend to crystallize during such high temperature exposure. Crystallization causes changes in conductivity and these materials tend to become more conductive. Addition of aluminum into metal nitrides improves thermal stability of these materials by withstanding crystallization and remaining in an amorphous state. In some embodiments, the material of embedded resistor 310 remains substantially amorphous after being subjected to high temperatures, such as diode activation annealing of up to 750° C. for up to about 60 seconds.

As noted above, certain materials may be difficult to form into thin layers, while other materials can be formed into layers of essentially any thickness. In some embodiments, embedded resistor 310 has a thickness of between about 10 Angstroms and 200 Angstroms or, more specifically, between about 20 Angstroms and 100 Angstroms thick. The footprint (i.e., cross-sectional area) of embedded resistor 310 may be between about 20 nanometers-square and 100 nanometers-square or, more specifically, between about 30 nanometers-square and 60 nanometers-square, such as about 60 nanometers-square. One skilled in the art will appreciate that the overall resistance (R) of embedded resistor 310 can be adjusted by varying the thickness, footprint, material composition, and/or morphology, such as a crystalline or an amorphous structure. The material composition and morphology impact resistivity of the material forming embedded resistor 310. The overall resistance of embedded resistor may be 90 kilo-Ohm to 1 MOhm, in some embodiments.

Some parameters, such as the footprint, may be restricted by other design considerations. Specifically, the footprint of the device is generally fixed by the size and lateral spacing of ReRAM cells 300, and thus is generally not easily varied from one switching memory device to the next. As such, the resistance of embedded resistor 310 needs to be controlled by adjusting other parameters, such as the thickness or composition.

In some embodiments, embedded resistor 310 provides a substantially constant resistivity when a field of up to about 8 Mega-Volts per centimeter or, more specifically, up to about 8 Mega-Volts per centimeter is applied to embedded resistor 310. For purposes of this disclosure, the substantially constant resistivity is defined as a resistivity that changes by less than one order of magnitude (i.e., less than about 10 times). In some embodiments, the resistivity of the material forming embedded resistor 310 is between about 0.1 Ohm-centimeter to 40 Ohm-centimeter or, more specifically, between about 1 Ohm-centimeter to 4 Ohm-centimeter.

As noted above, materials used to form embedded resistor 310 include various metal aluminum nitrides. The materials may not be oxygen-scavenging in order to maintain performance of ReRAM cell 300. The base metal may be selected from Groups IIIA-VIIA and IIIB-VIIB of the periodic table, such as zirconium (Zr), vanadium (V), niobium (Nb), chromium (Cr), aluminum, (Al), hafnium (Hf), tantalum (Ta), titanium (Ti), tungsten (W), and molybdenum (Mo). Specific examples of suitable ternary compounds include $Hf_xAl_yN_z$, $Ta_xAl_yN_z$, $Ti_xAl_yN_z$, $W_xAl_yN_z$, and $Mo_xAl_yN_z$. An example of a suitable quaternary compound is $Hf_aTa_bAl_yN_z$. Other examples of base metals include gadolinium (Ga), Terbium (Tb), dysprosium (Dy), Holmium (Ho), Erbium (Er), Thulium (Tm), Ytterbium (Yb), and Lutetium (Lu).

When a material for embedded resistor 310 includes two or more base metals, these base metals may be distributed evenly or non-evenly throughout embedded resistor 310. For example, one base metal (e.g., hafnium) may be concentrated at the side of embedded resistor 310. This metal may provide more beneficial interface properties, such as an ohmic contact. The other base metal (e.g., tantalum) may be concentrated away from the sides and may provide more beneficial bulk properties, such as high breakdown voltage and thermal stability. When two base metals are used their atomic ratio may be between about 0.1 and 10 or, more specifically, between about 0.5 and 5, such as about 1.

Atomic ratios of one or more base metals to aluminum in materials forming embedded resistor may be between about 0.1 to 10 or, more specifically, between 0.5 and 5, such as about 1. The precise ratio is determined by the resistivity requirement. Additional base metal tends to reduce resistivity, while additional aluminum tends to increase resistivity. Without being restricted to any particular theory, it is believed that the addition of aluminum helps the material retain an amorphous state and disrupts conduction, which results in increased scattering and thus a high resistance. Metal aluminum nitride materials may be viewed as base metal nitride clusters distributed within an aluminum nitride matrix. Clusters themselves and contacts between these clusters provide conductivity within embedded resistor 310. The aluminum nitride matrix may contribute to conductivity, mainly due to voltage induced conductivity, but this conductivity is not desirable.

Furthermore, aluminum helps stabilizing the overall material forming embedded resistor 310 by keeping the material amorphous and preserving and/or enhancing the annealed resistance properties of the material. As such, metal aluminum nitrides are more suitable for memory embedded resistor applications than some conventionally used materials. For example, metal aluminum nitrides tend to be thermally stable and substantially unaffected by high-temperature annealing processes use for diode activation. The overall amount of aluminum in a material forming embedded resistor 310 may be between 10 percent atomic and 80 percent atomic, or more specifically, between 20 percent atomic and 40 percent atomic.

The concentration of nitrogen may be between 10 percent atomic and 80 percent atomic, or more specifically, between 20 percent atomic and 60 percent atomic. The aluminum nitride portion of the metal aluminum nitride tend to be more thermally stable than the base metal nitride, which may lose some nitrogen, which transfers into the aluminum nitride portion or other components of ReRAM cell 300 or leaves the cell completely.

Processing Examples

Figure 4:
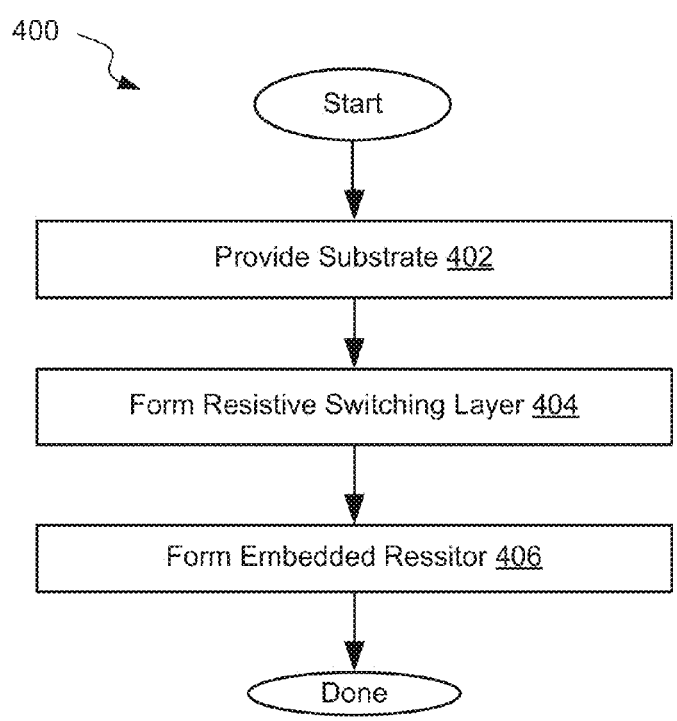
FIG. 4 illustrates a process flowchart corresponding to a method of fabricating a ReRAM cell, in accordance with some embodiments.

FIG. 4 illustrates a process flowchart corresponding to method 400 of fabricating a ReRAM cell, in accordance with some embodiments. Method 400 may commence with providing a substrate during operation 402. The substrate may include some components, such as a bottom signal line and a current steering element. In other embodiments, method 400 involves forming the bottom signal line and, for example, the current steering element on the substrate. The signal line electrode can be made of silicon (e.g., doped polysilicon), a silicide, titanium nitride, or other appropriate materials listed elsewhere in this document. For example, a titanium nitride layer may be formed using PVD or other suitable deposition techniques. Deposition of the titanium nitride layer may be performed using a titanium target in a nitrogen atmosphere maintained at a pressure of between about 1-20 mTorr. The power may be maintained at 150-500 Watts with resulting in a deposition rate of about 0.5-5 Angstroms per second. These process parameters are provided as examples and generally depend on deposited materials, tools, deposition rates, and other factors. Other processing techniques, such as ALD, PLD, CVD, evaporation, and the like can also be used to deposit the bottom signal line and, in some embodiments, the current steering element.

Method 400 may proceed with forming a resistive switching layer during operation 404. The resistive switching layer may be formed directed over the bottom signal line, the current steering element, an intermediate electrode, or some other component. The resistive switching layer may be deposited using PVD or other suitable techniques. For example, a hafnium oxide layer having a thickness of between about 5-500 Angstroms may be formed using reactive sputtering by employing a metal hafnium target in a 20-60% oxygen atmosphere. Power of 100-1000 Watts (W) may be used to achieve deposition rates of between about 0.1 and 1.0 Angstroms per second. These process parameters are provided as examples and generally depend on deposited materials, tools, deposition rates, and other factors. Other processing techniques, such as ALD, PLD, CVD, evaporation, and the like can also be used to deposit the resistive switching layer. For example, ALD can be used to form a hafnium oxide layer using hafnium precursors, such as tetrakis(diethylamido) hafnium (TDEAHf), tetrakis(dimethylamido) hafnium (TDMAHf), tetrakis(ethylmethylamido) hafnium (TEMAHf) or hafnium chloride (HfCl$_4$), and a suitable oxidant, such as water, oxygen plasma, or ozone.

A resistive switching layer may include multiple metals. For example, one metal may be used to dope an oxide of another metal. Two or more metals may be co-deposited to form one common layer or deposited in sequences to form multiple sub-layers of the resistive switching layer. For example, PVD may be used to deposit a layer containing hafnium oxide and aluminum oxide. Specifically, a co-sputtering arrangement using either a hafnium target and an aluminum target in an oxygen containing atmosphere or a hafnium oxide target and an aluminum oxide target may be used. In another example, ALD may be used to co-inject hafnium and aluminum precursors at desired proportions to co-deposit a metal oxide layer or to form multiple sub-layers. In some embodiments, operation 404 may involve ion implantation. The ion implantation can isovalently or aliovalently dope the resistive switching layer and can reduce forming voltages, improve set and reset voltage distributions, and increase device yield.

In some embodiments, method 400 may involve formation of one or more additional layers in between the resistive switching and embedded resistor. For example, an intermediate electrode may be formed over the resistive switching layer and prior to forming the embedded resistor. The intermediate electrode may be formed using operations similar to forming the signal lines as described elsewhere in this document.

Method 400 may proceed with forming an embedded resistor using operation 406. Various examples of embedded resistors are described above with reference to FIG. 3. In some embodiments, the embedded resistor is formed from tantalum aluminum nitride (Ta$_x$Al$_y$N$_z$) using PVD, ALD, or other techniques. The ratio of x:y may be anywhere from 3:1 to 1:3, such as 1:1, and z=0.4 to 0.8, such as 0.5. The PVD target may include a combination of tantalum and aluminum and may be sputtered with plasma in a nitrogen-containing atmosphere. In this example, the composition of the embedded resistor depends on nitrogen concentration in the sputtering environment. For example, changing the sputtering atmosphere from a 20% nitrogen-containing composition to a 50% nitrogen-containing composition will provide an embedded resistor with a higher nitrogen concentration and higher resistivity. As such, the concentration of nitrogen may be varied to achieve a desirable resistivity.

In some embodiments, the embedded resistor include titanium aluminum nitride (Ti$_x$Al$_y$N$_z$) formed using a PVD process. The PVD target may include a titanium-aluminum material that is sputtered with plasma in a nitrogen-containing atmosphere. In this example, the process and thus the final film composition tends to be nitrogen independent yet aluminum dependent. Unlike the tantalum aluminum nitride example, in which the resistivity changes more with nitrogen than with the metal to aluminum ratio, the titanium-to-aluminum ratio strongly determines resistivity of titanium aluminum nitride. In this example, the ratio of x:y may be 1:2 or 2:1. In other words, x≈y, x>y, or x<y. The amount of z=0.4 to 0.8, such as 0.5.

ALD may be also used to deposit an embedded resistor containing a metal aluminum nitride. The embedded resistor may be formed as alternating layers of a metal nitride and aluminum nitride. Some examples of aluminum containing precursors include aluminum tris(2,2,6,6-tetramethyl-3,5-heptanedionate) (Al(OCC(CH3)$_3$CHCOC(CH$_3$)$_3$)$_3$), triisobutyl aluminum ([(CH$_3$)$_2$CHCH$_2$]$_3$Al), trimethyl aluminum ((CH$_3$)$_3$Al)—also known as TMA, Tris(dimethyl amido) aluminum (Al(N(CH$_3$)$_2$)$_3$). The nitrogen containing oxidizing agent may include ammonia (NH3), which in some embodiments may be mixed with carbon monoxide (CO). examples of hafnium containing precursors include bis(tert-butylcyclopentadienyl)dimethyl hafnium (C$_{20}$H$_{32}$Hf), bis(methyl-η5-cyclopentadienyl) methoxymethyl hafnium (HfCH$_3$(OCH$_3$)[C$_5$H$_4$(CH$_3$)]$_2$), bis(trimethylsilyl) amido hafnium chloride ([[(CH$_3$)$_3$Si]$_2$N]$_2$HfCl$_2$), dimethylbis(cyclopentadienyl) hafnium ((C$_5$H$_5$)$_2$Hf(CH$_3$)$_2$), hafnium isopropoxide isopropanol adduct (C$_{12}$H$_{28}$HfO$_4$), tetrakis(diethylamido) hafnium ([(CH$_2$CH$_3$)$_2$N]$_4$Hf)—also known as TEMAH, tetrakis(ethylmethylamido) hafnium ([(CH$_3$)(C$_2$H$_5$)N]$_4$Hf), tetrakis(dimethylamido) hafnium ([(CH$_3$)$_2$N]$_4$Hf)—also known as TDMAH, and hafnium tert-butoxide (HTB). Some hafnium containing precursors can be represented with a formula (RR'N) 4Hf, where R and R' are independent hydrogen or alkyl groups and may be the same or different. Some example of tantalum containing precursors include pentakis (dimethylamino) tantalum (Ta(N(CH3)2)5), tris(diethylamido)(tert-butylimido) tantalum ((CH3)3CNTa(N(C2H5)2)3), tris(diethylamido)(ethylimido) tantalum (C2H5NTa(N(C2H5)2)3), tris(ethylmethylamido)(tert-butylimido) tantalum (C13H33N4Ta). Examples of tungsten containing precursors include bis(butylcyclopentadienyl) tungsten diiodide (C18H26I2W), bis(tert-butylimino)bis(tert-butylamino) tungsten ((C4H9NH)2W(C4H9N)2), bis(tert-butylimino)bis(dimethylamino) tungsten (((CH3)3CN)2W(N(CH3)2)2), bis(cyclopentadienyl) tungstendichloride (C10H10Cl2W), bis(cyclopentadienyl) tungsten dihydride (C10H12W), bis(isopropylcyclopentadienyl) tungsten dihydride ((C5H4CH(CH3)2)2WH2), cyclopentadienyl tungsten tricarbonyl hydride (C8H6O3W), tetracarbonyl(1,5-cyclooctadiene)tungsten (C12H12O4W), triamminetungsten tricarbonyl ((NH3)3W(CO)3), tungsten hexacarbonyl (W(CO)6).

At some point, method 400 may proceed with forming a top signal line. The top signal line may have the same composition and/or structure as the bottom signal line. In some embodiments, the top signal line is a noble or near-noble metal, such as iridium, iridium oxide, platinum, ruthenium, or ruthenium oxide. The top signal line may be deposited using PVD, ALD, CVD, PLD, evaporation, or another suitable technique. For example, a platinum signal line can be deposited using PVD by sputtering a metal target at 100-500 W with a pressure of about 2-10 mTorr resulting in a deposition rate of 0.5-10 Angstroms per second. The duration of the sputtering determines the thickness of the signal line. As mentioned above, it is understood that specifications for performing the deposition depend on the material to be deposited, the desired deposition rate, the tool being used, and other factors.

Memory Array Examples

Figure 5A:
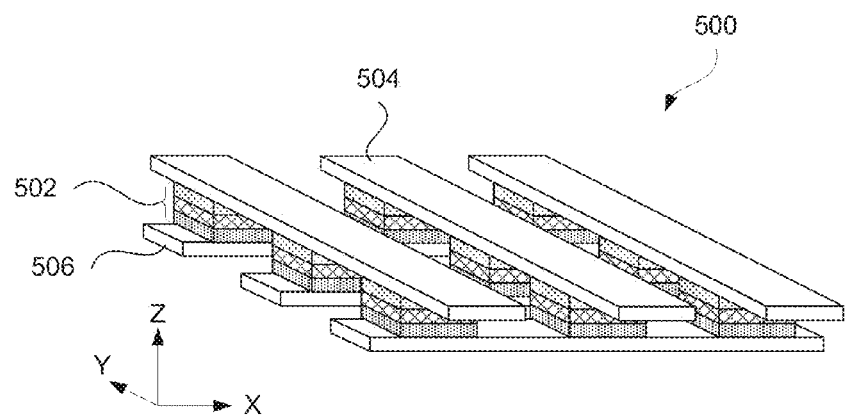
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as top and bottom electrodes, resistance switching layer, embedded resistors, embedded current steering elements, and the like, some of which are further described elsewhere in this document. In some embodiments, a ReRAM cell includes multiple resistance switching layers provided in between a crossing pair of signal lines 504 and 506.

As stated above, various read and write controllers may be used to control operations of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
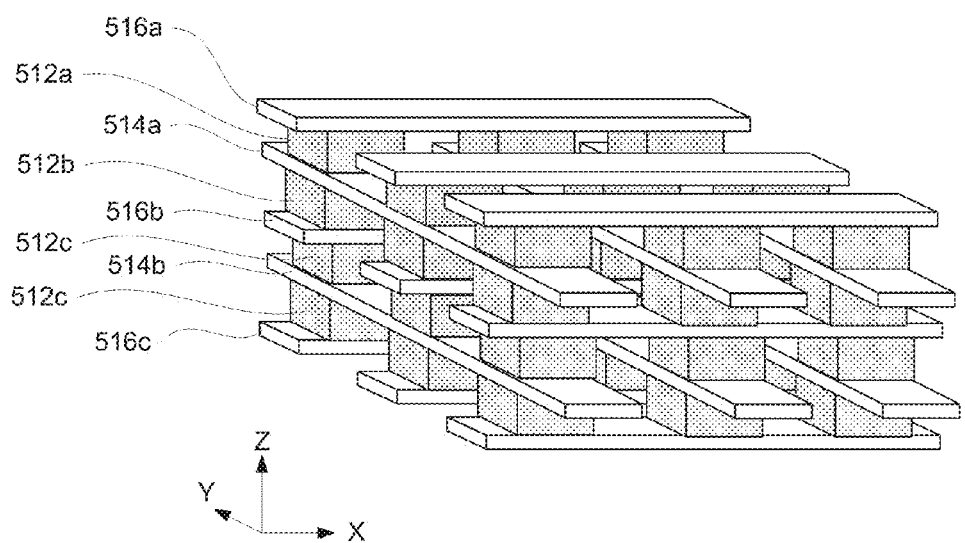

In some embodiments, a memory device may include multiple array layers as, for example, illustrated in FIG. 5B. In this example, five sets of signal lines 514a-b and 516a-c are shared by four ReRAM arrays 512a-c. As with the previous example, each ReRAM array is supported by two sets of signal lines, e.g., array 512a is supported by 514a and 516a. However, middle signal lines 514a-b and 516b, each is shared by two sets ReRAM arrays. For example, signal line set 514a provides connections to arrays 512a and 512b. Top and bottom sets of signal lines 516a and 516c are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:
1. A method comprising:
 forming a resistive switching layer,
  the resistive switching layer operable to change between a low resistive state and a high resistive state;
 forming an electrode over the resistive switching layer; and
 forming an embedded resistor over the electrode such that the electrode is disposed between the embedded resistor and the resistive switching layer,
  wherein the embedded resistor comprises a metal aluminum nitride,
  wherein the metal aluminum nitride comprises one or more metals other than aluminum, and
  wherein the embedded resistor is operable to maintain a constant resistance while the resistive switching layer changes between the low resistive state and the high resistive state.

2. The method of claim 1, wherein the embedded resistor is formed using a PVD process.

3. The method of claim 1, wherein the embedded resistor is formed using an ALD process.

4. The method of claim 1, wherein the resistive switching layer is formed using reactive sputtering of a target in an oxygen containing atmosphere, the target comprising hafnium.

5. The method of claim 1, wherein forming the resistive switching layer comprises an ion implantation process.

6. The method of claim 1, further comprising annealing the embedded resistor at a temperature of up to about 750° C. for up to 60 seconds, and wherein a material of the embedded resistor is amorphous after the annealing.

7. The method of claim 1, wherein a concentration of nitrogen in the embedded resistor is between 20 atomic % and 60 atomic %.

8. The method of claim 1, wherein a concentration ratio of the one or more metals to aluminum is between 0.1 and 10.

9. The method of claim 1, wherein the one or more metals comprise a first metal and a second metal.

10. The method of claim 1, wherein the embedded resistor has a resistivity between 0.1 Ohm-centimeter to 40 Ohm-centimeter.

11. The method of claim 1, wherein the embedded resistor has a thickness between 50 Angstroms to 500 Angstroms.

12. The method claim 1, further comprising, prior to forming the resistive switching layer, forming a current steering element such that the current steering element is connected in series with the resistive switching layer.

13. The method of claim 2, wherein the embedded resistor is formed in a nitrogen-containing atmosphere.

14. The method of claim 2, wherein a sputtering target is used to form the embedded resistor during the PVD process, wherein the sputtering target comprises aluminum and the one or more metals other than aluminum.

15. The method of claim 14, wherein the one or more metals comprise one or more of zirconium, vanadium, niobium, chromium, hafnium, tantalum, titanium, tungsten, or molybdenum.

16. The method of claim 3, wherein the embedded resistor is formed as alternating layers of a metal nitride and an aluminum nitride.

17. The method of claim 4, wherein the target further comprises aluminum.

18. The method of claim 9, wherein a concentration ratio of the first metal to the second metal is between 0.5 and 2 based on atomic concentrations.

19. The method of claim 9, wherein the one or more metals comprise hafnium and tantalum.

20. The method of claim 12, wherein the current steering element comprises a diode.

* * * * *